United States Patent
Chen (10) Patent No.: US 11,367,506 B2
(45) Date of Patent: Jun. 21, 2022

(54) DATA CHANNEL AGING CIRCUIT, MEMORY AND AGING METHOD

(71) Applicant: Changxin Memory Technologies, Inc., Anhui (CN)

(72) Inventor: Yung-Shiuan Chen, Hefei (CN)

(73) Assignee: Changxin Memory Technologies, Inc., Hefei (CN)

(*) Notice: Subject to any disclaimer, the term of this patent is extended or adjusted under 35 U.S.C. 154(b) by 0 days.

(21) Appl. No.: 17/230,829

(22) Filed: Apr. 14, 2021

(65) Prior Publication Data

US 2021/0233602 A1  Jul. 29, 2021

Related U.S. Application Data

(63) Continuation of application No. PCT/CN2019/110551, filed on Oct. 11, 2019.

(30) Foreign Application Priority Data

Oct. 16, 2018 (CN) .......................... 201811202829.4
Oct. 16, 2018 (CN) .......................... 201821678022.3

(51) Int. Cl.
*G11C 29/00* (2006.01)
*G11C 29/50* (2006.01)

(52) U.S. Cl.
CPC .................. *G11C 29/50004* (2013.01); *G11C 2029/5004* (2013.01)

(58) Field of Classification Search
CPC ... G11C 29/50004; G11C 29/50; G11C 29/12; G11C 29/12005; G11C 2029/5004
See application file for complete search history.

(56) References Cited

U.S. PATENT DOCUMENTS 5,451,896 A * 9/1995 Mori ................... H01L 27/0214
327/309
2003/0081490 A1    5/2003 Nagasawa et al.
(Continued)

FOREIGN PATENT DOCUMENTS

| CN | 201436591 U | 4/2010 |
| CN | 109087684 A | 12/2018 |
| CN | 208834751 U | 5/2019 |

OTHER PUBLICATIONS

PCT International Search Report and the Written Opinion dated Jan. 9, 2020, issued in related International Application No. PCT/CN2019/110551 (8 pages).

*Primary Examiner* — Christine T. Tu
(74) *Attorney, Agent, or Firm* — Sheppard, Mullin, Richter & Hampton LLP (57) ABSTRACT

A data channel aging circuit, a memory, a data channel aging method, and a memory aging method are provided. The data channel aging circuit includes: a memory cell storing a voltage switching signal configured to provide a target voltage state for each of a plurality of data channels in an integrated circuit (IC); a control unit configured to generate a voltage control signal and to send the voltage control signal to each data channel; and a strobe unit configured to switch a conductive state of each data channel based on the voltage switching signal, and to adjust a voltage level of each data channel through the voltage control signal to induce voltage stress aging. The data channel aging circuit improves the reliability of the aging test and the operational stability of the IC products that have went through the aging test.

16 Claims, 3 Drawing Sheets

(56) References Cited

U.S. PATENT DOCUMENTS

2007/0147146 A1    6/2007    Yamada et al.
2009/0039950 A1*    2/2009    Takeuchi ............... G11C 29/12
                                                                   327/541
2011/0102072 A1*    5/2011    Idgunji ............. H03K 19/0005
                                                                   327/540

* cited by examiner

DATA CHANNEL AGING CIRCUIT, MEMORY AND AGING METHOD

CROSS-REFERENCE TO RELATED APPLICATIONS

This application is a continuation application of International Patent Application No. PCT/CN2019/110551, filed on Oct. 11, 2019, which is based on and claims priority of the Chinese Patent Applications No. 201811202829.4, and No. 201821678022.3, both filed on Oct. 16, 2018. The above-referenced applications are incorporated herein by reference in their entirety.

TECHNICAL FIELD

The present disclosure relates generally to the technical field of electrical technologies and, more specifically, to a data channel aging circuit, a memory, a data channel aging method, and a memory aging method.

BACKGROUND

As an important part of the integrated circuit (IC) production process, the aging test is designed to expose the defects of an IC as early as possible through continuously or periodically overloading the IC during a fixed period of time. The aging test may reduce the failure rate of IC products in the early stage of usage, and thereby improving the stability and reliability of IC products.

An IC aging machine is generally used for the aging test on ICs. The IC aging machine can transmit data to the IC to be tested through the test channels under designated external test conditions (e.g., high temperature, bias voltage, etc.) to accelerate the aging speed of ICs under working conditions. The number of ICs that can simultaneously undergo an aging testing, however, is limited by the number of available test channels. Therefore, selecting only some of the data channels of the ICs for data transmission in a data compression mode may increase the number of ICs that can simultaneously tested, thereby improving the efficiency of the aging test on the ICs.

However, the aging test performed in the data compression mode can only be conducted for some of the data channels in the ICs, and defects in the data channels that have not been tested cannot be detected. In other words, the ICs that have passed the aging test in this manner may still contain some uncovered defects. Therefore, how to improve the reliability of the aging test without affecting the test efficiency is an urgent problem to be solved.

It is to be understood that the above information is only used to facilitate the understanding the background of the present invention, and thus may include information that does not constitute prior art known to a person of ordinary skill in the art.

SUMMARY

In view of the limitations of existing technologies described above, this disclosure provides a data channel aging circuit, a memory, a data channel aging method, and a memory aging method that address the aforementioned limitations of existing technologies that lead to poor reliability of aging tests in the related art.

One aspect of the present disclosure is directed to a data channel aging circuit, configured to perform an aging test on an integrated circuit (IC). The data channel aging circuit may comprise a memory cell, a control unit, and a strobe unit. The memory cell may store a voltage switching signal configured to provide a target voltage state for each of a plurality of data channels in the IC. The control unit may be configured to generate a voltage control signal and to send the voltage control signal to each of the plurality of data channels. The strobe unit may be configured to switch a conductive state of each of the plurality of data channels based on the voltage switching signal, and to adjust a voltage level of each of the plurality of data channels through the voltage control signal to induce voltage stress aging.

In some embodiments of the present disclosure, the control unit may comprise a signal input, a voltage converter, and a signal output. The signal input may be configured to receive an aging control signal, the voltage converter may be configured to perform voltage conversion on the aging control signal to generate the voltage control signal, and the signal output may be configured to send the voltage control signal to each of the plurality of data channels.

In some embodiments of the present disclosure, the voltage converter may comprise a first capacitor, a first semiconductor switch, a second semiconductor switch, and a second capacitor. The first capacitor may have a first end coupled to the signal input and a second end coupled to an intermediate node. The first semiconductor switch may have a first terminal coupled to the intermediate node, and a second terminal and a gate of the first semiconductor switch may both be coupled to a first voltage end. The second semiconductor switch may have a first terminal coupled to the signal output, and a second terminal and a gate of the second semiconductor switch may both be coupled to the intermediate node. The second capacitor may have a first end coupled to a second voltage end and a second end coupled to the signal output.

In some embodiments of the present disclosure, the voltage converter may further comprise an inverter arranged between the signal input and the first capacitor.

In some embodiments of the present disclosure, a voltage level of the first voltage end may be configured to be an operating voltage of the IC, and a voltage level of the second voltage end may be configured to be a ground voltage.

In some embodiments of the present disclosure, the strobe unit may comprise a decoder configured to decode the voltage switching signal stored in the memory cell, and to switch on one or more of the plurality of data channels based on the voltage switching signal.

In some embodiments of the present disclosure, the strobe unit may be coupled to all or some of the plurality of data channels of the IC.

Another aspect of the present disclosure is directed to a memory. The memory may comprise a data channel aging circuit and an integrated circuit (IC). The data channel aging circuit may be configured to perform an aging test on an IC, and may comprise a memory cell, a control cell, and a strobe unit. The memory cell may store a voltage switching signal configured to provide a target voltage state for each of a plurality of data channels in the IC. The control unit may be configured to generate a voltage control signal and to send the voltage control signal to each of the plurality of data channels. The strobe unit may be configured to switch a conductive state of each of the plurality of data channels based on the voltage switching signal, and to adjust a voltage level of each of the plurality of data channels through the voltage control signal to induce voltage stress aging.

In some embodiments of the present disclosure, the control unit may comprise a signal input, a voltage converter, and a signal output. The signal input may be configured to receive an aging control signal, the voltage converter may be configured to perform voltage conversion on the aging control signal to generate the voltage control signal, and the signal output may be configured to send the voltage control signal to each of the plurality of data channels.

In some embodiments of the present disclosure, the voltage converter may comprise a first capacitor, a first semiconductor switch, a second semiconductor switch, and a second capacitor. The first capacitor may have a first end coupled to the signal input and a second end coupled to an intermediate node. The first semiconductor switch may have a first terminal coupled to the intermediate node, and a second terminal and a gate of the first semiconductor switch may both be coupled to a first voltage end. The second semiconductor switch may have a first terminal coupled to the signal output, and a second terminal and a gate of the second semiconductor switch may both be coupled to the intermediate node. The second capacitor may have a first end coupled to a second voltage end and a second end coupled to the signal output.

In some embodiments of the present disclosure, the voltage converter may further comprise an inverter arranged between the signal input and the first capacitor.

In some embodiments of the present disclosure, a voltage level of the first voltage end may be configured to be an operating voltage of the IC, and a voltage level of the second voltage end may be configured to be a ground voltage.

In some embodiments of the present disclosure, the strobe unit may comprise a decoder configured to decode the voltage switching signal stored in the memory cell, and to switch on one or more of the plurality of data channels based on the voltage switching signal.

In some embodiments of the present disclosure, the strobe unit may be coupled to all or some of the plurality of data channels of the IC.

Another aspect of the present disclosure is directed to a data channel aging method for performing an aging test on an IC. The method may comprise: determining a target voltage state of each of a plurality of data channels in the IC according to a voltage switching signal; switching a conductive state of each of the plurality of data channels based on the voltage switching signal; and adjusting a voltage level of the each of the plurality of data channels through a voltage control signal to induce voltage stress aging.

Another aspect of the present disclosure is directed to an aging method for a memory. The memory may comprise an IC comprising a plurality of data channels. Some of the data channels may be configured as machine aging data channels, and the rest of the data channels may be configured as voltage aging data channels. The method may comprise: connecting the machine aging data channels to an IC aging machine. The IC aging machine may transmit data to the machine aging data channels.

The method may further include: determining a target voltage state of each of the voltage aging data channels according to a voltage switching signal; switching a conductive state of each of the voltage aging data channels based on the voltage switching signal; and adjusting a voltage level of each of the voltage aging data channels through a voltage control signal to induce voltage stress aging.

In the data channel aging circuit disclosed in this specification, a voltage control signal may be sent to each of a plurality of data channels of an IC, and a corresponding voltage switching signal may be used, so that the voltage state of each data channel may be switched to induce voltage stress aging. Therefore, the aging test can be performed on all or most of the data channels of the IC, thereby improving the reliability of the aging test and the operational stability of the IC products that have went through the aging test.

The above general description and the following detailed description are intended to be illustrative and not restrictive, which shall not be considered as limitations to the present disclosure.

BRIEF DESCRIPTION OF THE DRAWINGS

The accompanying drawings, which are incorporated in the description of the present disclosure as a part of the description, show embodiments of the present disclosure, and explain the nature of the present disclosure together with the description. It is apparent that the drawings in the following description are only some of the embodiments of the present disclosure, and other drawings may be obtained by those skilled in the art without creative work.

LIST OF REFERENCE NUMERALS IN DRAWINGS

11: memory cell;
12: control unit;
13: strobe unit;
201: signal input;
202: first capacitor;
203: inverter;
204: intermediate node;
205: first semiconductor switch;
206: first voltage end;
207: second semiconductor switch;
208: second capacitor;
209: second voltage end;
210: signal output.

DETAILED DESCRIPTION OF THE EMBODIMENTS

Exemplary embodiments will now be described in greater details with reference to the accompanying drawings. However, the exemplary embodiments can be implemented in a variety of forms and should not be construed as being limited to the embodiments set forth herein. Instead, the exemplary embodiments may make the present disclosure more comprehensive and complete, and convey the concept of the present disclosure to those skilled in the art. The same reference signs in the drawings may denote the same or similar structures, and thus their detailed description will be omitted.

Although the relative terms such as "above" and "below" are used in the present disclosure to describe the relative relationship between one component to another component shown in the figures, these terms are used for convenience only, for example, according to the directions shown in accompanying drawings. It can be understood that if objects shown in accompanying drawings are reversed, the component located "above" another component shall change to be located "below" the another component accordingly. When a structure is "above"/"on" another structure, it may be understood that a structure is integrally formed above another structure, or that a structure is "directly" disposed on another structure, or that a structure is "indirectly" disposed on another structure through another structure.

The terms "a", "an", "the", and "at least one" are used to indicate the presence of one or more elements/parts, etc. The terms "including" and "having" are used for open-ended mode, which means additional elements/components or the like can also be provided or included in addition to the listed elements/components/etc. Moreover, the terms "first" and "second" and the like in the claims and the description are used only as a mark, not a numerical limit to the corresponding objects.

In an exemplary embodiment of the present disclosure, a data channel aging circuit is provided. The data channel aging circuit may be configured to perform an aging test on an integrated circuit (IC), and in particular, to perform an aging test on all or most of the data channels of the IC. The data channels may refer to the data input/output path (I/O path) in the IC.

Figure 1:
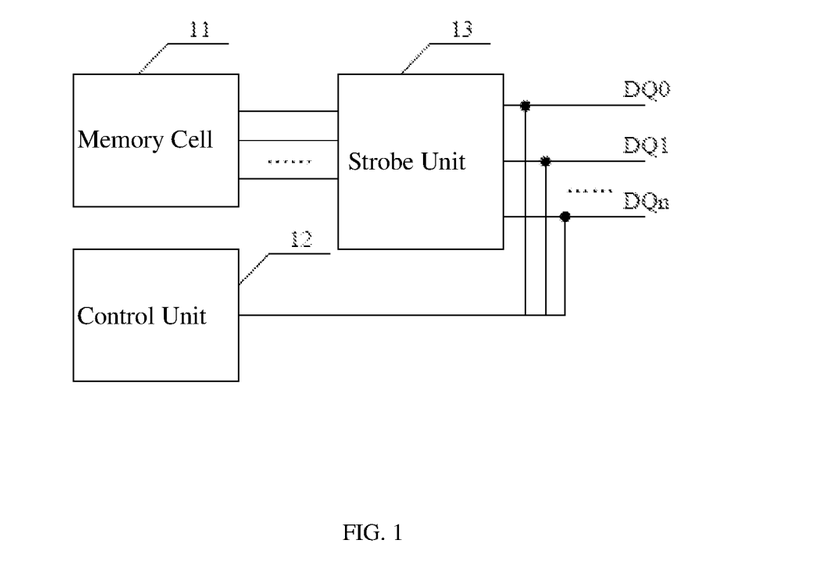
FIG. 1 is a structural schematic diagram of a data channel aging circuit in accordance with one embodiment of the present disclosure.

As shown in FIG. 1, the data channel aging circuit may include a memory cell 11, a control unit 12, and a strobe unit 13. The memory cell 11 and the control unit 12 may be respectively coupled to the strobe unit 13, and strobe unit 13 may be coupled to each of the plurality of data channels DQ0, DQ1, . . . , DQn of an IC. The data channels herein may be all the data channels of the IC, or some of the data channels of the IC. This invention is not limited in this regard.

The memory cell 11 may store a voltage switching signal configured to provide a target voltage state for each of the plurality of data channels of the IC. The target voltage state may be either a high potential state or a low potential state, and each data channel may be switched between these two potential states. The target voltage state of each data channel may be obtained through the voltage switching signal stored in the memory cell 11, thereby providing a reference and basis for subsequent voltage control.

The control unit 12 may be configured to generate a voltage control signal and to send the voltage control signal to each of the plurality of data channels in the IC. The voltage control signal may be configured to increase or lower the voltage level on each data channel. For example, if the background voltage on a data channel is initially a relatively low voltage level and the voltage control signal is a high-potential voltage signal of the same phase, the voltage level of the data channel may be pulled up under the control of the voltage control signal. The rise/fall of the voltage level on each data channel under the control of the voltage control signal may depend on different voltage control signals as well as the conductive state of each data channel.

The strobe unit 13 may be configured to switch the conductive state of each data channel to adjust the respective voltage thereof. Specifically, the strobe unit 13 may be configured to switch the conductive state of each data channel based on the voltage switching signal stored in the memory cell 11, and to adjust the voltage level of each data channel through the voltage control signal sent by the control unit 12. The voltage level of the data channel that has been switched on may rise or fall under the control of the voltage control signal. In addition, changes in the voltage switching signal may also cause the voltage level of each data channel to change from time to time. By switching the voltage, the background voltage of each data channel may be different, so that voltage stress aging may be induced in each data channel.

In the data channel aging circuit provided by the present exemplary embodiment, a voltage control signal may be sent to each data channel of the IC, and a corresponding voltage switching signal may be used, so that the voltage state of each data channel can be switched to induce voltage stress aging. During the aging test of the IC, some of the data channels of the IC may be coupled to an IC aging machine, these data channels may be in the working state for data input/output. The voltage stress aging can be performed to other uncoupled data channels by using the data channel aging circuit in the present exemplary embodiment. Therefore, the aging test can be performed on all or most of the data channels of the IC, thereby improving the reliability of the aging test and the operational stability of the IC products that have went through the aging test.

Based on the above exemplary embodiments, the control unit 12 may further include a signal input terminal, a voltage converter, and a signal output. The signal input may be configured to receive an aging control signal, which may be a control signal read by an external circuit. During an aging test of the IC, after the aging test mode is selected, the data channel aging circuit may be started to perform voltage stress aging on each data channel upon reading the aging control signal.

The voltage converter may be configured to perform voltage conversion on the aging control signal received, and then generate a voltage control signal. The voltage converter may be implemented with a conventional DC-DC converter (e.g., a charge pump). In addition, the voltage converter may also be implemented with any other suitable electronic component or circuit structural unit capable of achieving voltage rising, voltage falling or voltage inversion. This invention is not limited in this regard.

The signal output may be configured to send a voltage control signal to each data channel. The signal output may be directly coupled to each data channel, or indirectly coupled to each data channel through the strobe unit 13. This invention is not limited in this regard.

Figure 2:
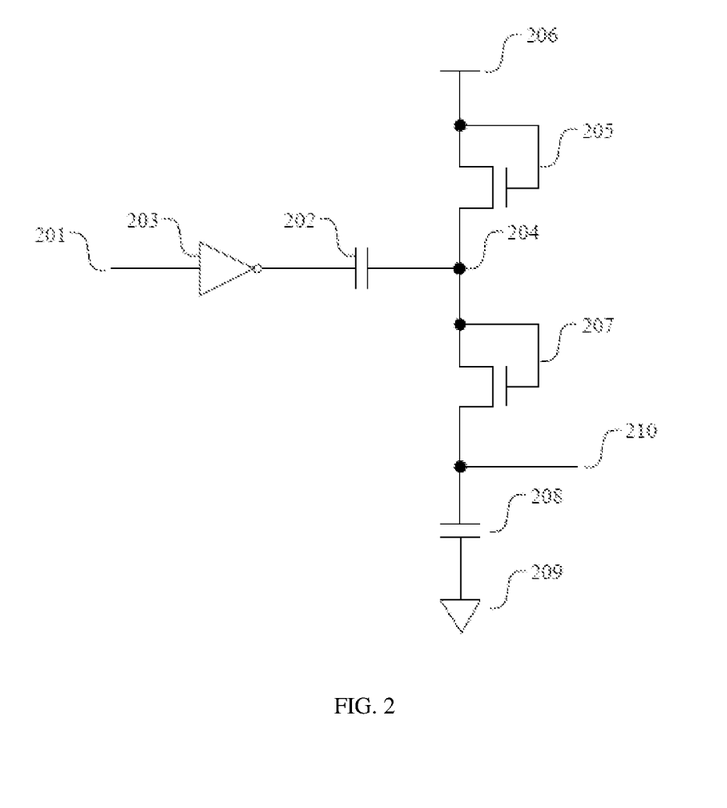
FIG. 2 is a structural schematic diagram of a control unit of a data channel aging circuit in accordance with one embodiment of the present disclosure.

The voltage converter in the exemplary embodiment may be a switched capacitor circuit unit, as shown in FIG. 2. The switched capacitor circuit unit may include a first capacitor 202, a first semiconductor switch 205, a second semiconductor switch 207, and a second capacitor 208. The first capacitor 202 may have a first end coupled to an output of an inverter 203 and a second end coupled to an intermediate node 204. An input of the inverter 203 may be coupled to the signal input 201. In some embodiments, the first end of the first capacitor 202 may be directly coupled to the signal input 201, and the inverter 203 may be omitted.

The first semiconductor switch 205 may have a first terminal coupled to the intermediate node 204. A second terminal and a gate of the first semiconductor switch 205 may both be coupled to a first voltage end 206. The voltage level of the first voltage end 206 may be an operating voltage of the IC.

The second semiconductor switch 207 may have a first terminal coupled to the signal output 210. A second terminal and a gate of the second semiconductor switch 207 may both be coupled to the intermediate node 204.

The second capacitor 208 may have a first end coupled to a second voltage end 209, and a second end coupled to the signal output 210. The voltage level of the second voltage end 209 may be a ground voltage.

Referring back to FIG. 1, in an exemplary embodiment of the present disclosure, the strobe unit 13 may include a decoder configured to decode a voltage switching signal stored in the memory cell 11. The strobe unit 13 may be configured to switch on one or more of the data channels based on the voltage switching signal. For example, the voltage switching signal stored in the memory cell 11 may be a logical string consisting of logical characters of 0 and 1, each corresponding to one of the sequentially arranged data channels. 0 in the logical string may represent a low potential state, and 1 in the logical string may represent a high potential state. The target voltage state of each data channel, which may be either a high level state or a low level state, can be obtained by decoding the logical string. The plurality of data channels may be in one of a plurality of potential states, as shown in Table 1, and different potential states may be controlled by different voltage switching signals.

TABLE 1

Potential State Switching Table for Each Data Channel

|     | State 1 | State 2 | ... | State m |
| --- | --- | --- | --- | --- |
| DQ0 | High | Low | ... | Low |
| DQ1 | Low | High | ... | Low |
| ... | ... | ... | ... | ... |
| DQn | Low | Low | ... | High |

Figure 3:
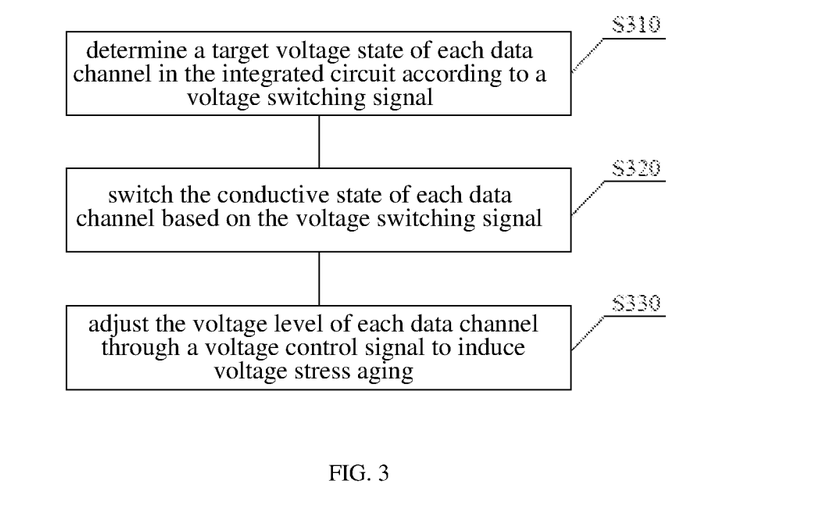
FIG. 3 is a flow chart illustrating a data channel aging method in accordance with one embodiment of the present disclosure.

Based on the data channel aging circuit provided by the aforementioned exemplary embodiments, this invention further provides a data channel aging method for performing an aging test on an IC. As shown in FIG. 3, the method may mainly include the following steps S310 through S330.

In step S310, a target voltage state of each data channel in the IC may be determined according to a voltage switching signal.

In this step, the target voltage state of each data channel in the IC may be determined based on the voltage switching signal stored in the memory cell. The target voltage state may be either a high potential state or a low potential state, and each data channel can be switched between two potential states. The target voltage state of each data channel can be obtained through the voltage switching signal stored in the memory cell 11, thereby providing a reference and basis for subsequent voltage control.

In step S320, the conductive state of each data channel may be switched based on the voltage switching signal.

Based on the voltage switching signal stored in the memory cell, the strobe unit can switch the conductive state of each data channel. For example, if the target voltage states of some of the data channels are a high potential state, the strobe unit may switch on these data channels.

In step S330, the voltage level of each data channel may be adjusted through a voltage control signal to induce voltage stress aging.

The voltage level of each data channel can be adjusted through the voltage control signal sent by the control unit, so that voltage stress aging can be induced. For example, if the voltage level of the selected data channel in step S320 was pulled up by the voltage control signal, the voltage levels of other data channels may be relatively reduced. If the voltage level of the selected data channel in step S320 was reduced by the voltage control signal, the voltage levels of other data channels may be relatively pulled up.

The data channel aging method provided by the exemplary embodiment may induce voltage stress aging by switching the background voltage of each data channel in the IC, thereby performing aging test on all data channels in the IC.

This invention further provides a memory. The memory may include a data channel aging circuit as provided in the aforementioned embodiments and an IC. The data channel aging circuit may be configured to perform an aging test on the IC. When the memory is subjected to the aging test, some of the data channels in the memory may be machine-aged by the IC aging machine, and others of the data channels can be subjected to voltage stress aging using the data channel aging circuit.

Based on this exemplary embodiment, this invention further provides an aging method for a memory. The memory configured to undergo the aging test of this method may include a plurality of data channels. Some of the data channels may be machine aging data channels, and others of the data channels may be voltage aging data channels.

Figure 4:
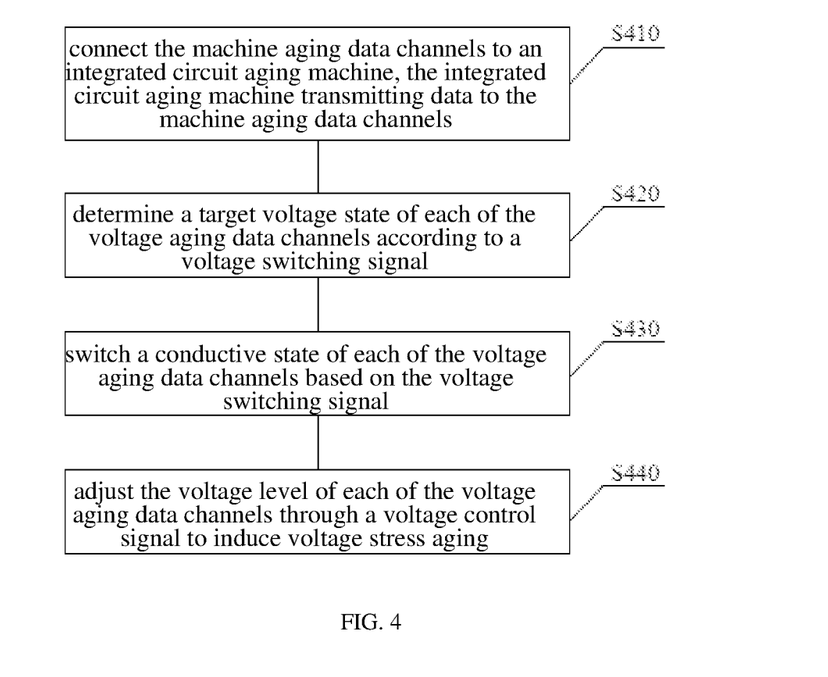
FIG. 4 is a flow chart illustrating a memory aging method in accordance with one embodiment of the present disclosure.

As shown in FIG. 4, the aging method for memory provided by the exemplary embodiment may include the following steps S410 through S440.

In step S410, the machine aging data channels may be connected to an IC aging machine. The IC aging machine may transmit data to the machine aging data channels.

In this step, the memory may first be coupled to an IC aging machine. Specifically, the machine aging data channels may be coupled to the test channels of the IC aging machine. After the aging test mode is selected, the IC aging machine may transmit data to the machine aging data channels.

In step S420, a target voltage state of each of the voltage aging data channels may be determined according to a voltage switching signal.

In the aging test mode, the data channel aging circuit can synchronously read an aging control signal and, under the control of the aging control signal, initiate a voltage stress aging process for the voltage aging data channels. Specifically, the target voltage state of each data channel in the IC may be determined according to the voltage switching signal stored in the memory cell. The target voltage state may be either a high potential state or a low potential state, and each data channel can be switched between the two potential states. The target voltage state of each data channel can be obtained through the voltage switching signal stored in the memory cell 11, thereby providing a reference and basis for subsequent voltage control.

In step S430, a conductive state of each of the voltage aging data channels may be switched based on the voltage switching signal.

Based on the voltage switching signal stored in the memory cell, the strobe unit can switch the conductive state of each data channel. For example, if the target voltage states of some of the data channels are a high potential state, the strobe unit may switch on these data channels.

In step S440, a voltage level of each of the voltage aging data channels may be adjusted through a voltage control signal to induce voltage stress aging.

The voltage level of each data channel can be adjusted through the voltage control signal sent by the control unit, so that voltage stress aging can be induced. For example, if the voltage level of the selected data channel in step S320 was pulled up by the voltage control signal, the voltage levels of other data channels may be relatively reduced. If the voltage level of the selected data channel in step S320 was reduced by the voltage control signal, the voltage levels of other data channels may be relatively pulled up.

The memory aging method provided by the exemplary embodiment can induce voltage stress aging by switching the background voltage of each voltage aging data channel in the memory, thereby performing the aging test on all data channels in the IC. After going through the machine aging and the voltage stress aging, the memory may be subject to a data input/output test. If a data transmission error occurs during the data input/output test, it can be determined that the memory is faulty, so that memory products with poor reliability can be identified in advance. Therefore, the reliability of the aging test, and the operational stability of the IC products having went through the aging test may be improved.

Other embodiments of the present invention will be apparent to those skilled in the art from considering the specification and practicing the invention disclosed herein. Accordingly, the present invention is intended to cover all and any variations, uses, or adaptations of the present invention which follow, in general, the principles thereof and include such departures from the present invention as come within common knowledge or customary practice within the art to which the invention pertains. It is also intended that the specification and examples be considered as exemplary only, with true scope and spirit of the present invention being indicated by the appended claims.

The invention claimed is:

1. A data channel aging circuit, configured to perform an aging test on an integrated circuit (IC), the data channel aging circuit comprising:
    a memory cell, storing a voltage switching signal configured to provide a target voltage state for each of a plurality of data channels in the IC;
    a control unit, configured to generate a voltage control signal and to send the voltage control signal to each of the plurality of data channels; and
    a strobe unit, configured to switch a conductive state of each of the plurality of data channels based on the voltage switching signal, and to adjust, through the voltage control signal, a voltage level of each of the plurality of data channels to induce voltage stress aging.

2. The data channel aging circuit of claim 1, wherein the control unit comprises:
    a signal input, configured to receive an aging control signal;
    a voltage converter, configured to perform voltage conversion on the aging control signal to generate the voltage control signal; and
    a signal output, configured to send the voltage control signal to each of the plurality of data channels.

3. The data channel aging circuit of claim 2, wherein the voltage converter comprises:
    a first capacitor having a first end coupled to the signal input and a second end coupled to an intermediate node;
    a first semiconductor switch having a first terminal coupled to the intermediate node, wherein a second terminal and a gate of the first semiconductor switch are both coupled to a first voltage end;
    a second semiconductor switch having a first terminal coupled to the signal output, wherein a second terminal and a gate of the second semiconductor switch are both coupled to the intermediate node; and
    a second capacitor having a first end coupled to a second voltage end and a second end coupled to the signal output.

4. The data channel aging circuit of claim 3, wherein the voltage converter further comprises:
    an inverter arranged between the signal input and the first capacitor.

5. The data channel aging circuit of claim 3, wherein a voltage level of the first voltage end is configured to be an operating voltage of the IC, and a voltage level of the second voltage end is configured to be a ground voltage.

6. The data channel aging circuit of claim 1, wherein the strobe unit comprises:
    a decoder configured to decode the voltage switching signal stored in the memory cell, and to switch on one or more of the plurality of data channels based on the voltage switching signal.

7. The data channel aging circuit of claim 1, wherein the strobe unit is coupled to all or some of the plurality of data channels of the IC.

8. A memory, comprising a data channel aging circuit and an integrated circuit (IC), wherein the data channel aging circuit is configured to perform an aging test on the IC, and wherein the data channel aging circuit comprises:
    a memory cell, storing a voltage switching signal configured to provide a target voltage state for each of a plurality of data channels in the IC;
    a control unit, configured to generate a voltage control signal and to send the voltage control signal to each of the plurality of data channels; and
    a strobe unit, configured to switch a conductive state of each of the plurality of data channels based on the voltage switching signal, and to adjust, through the voltage control signal, a voltage level of each of the plurality of data channels to induce voltage stress aging.

9. The memory of claim 8, wherein the control unit comprises:
    a signal input, configured to receive an aging control signal;
    a voltage converter, configured to perform voltage conversion on the aging control signal to generate the voltage control signal; and
    a signal output, configured to send the voltage control signal to each of the plurality of data channels.

10. The memory of claim 9, wherein the voltage converter comprises:
    a first capacitor having a first end coupled to the signal input, and a second end coupled to an intermediate node;
    a first semiconductor switch having a first terminal coupled to the intermediate node, wherein a second terminal and a gate of the first semiconductor switch are both coupled to a first voltage end;
    a second semiconductor switch having a first terminal coupled to the signal output, wherein a second terminal and a gate of the second semiconductor switch are both coupled to the intermediate node; and
    a second capacitor having a first end coupled to a second voltage end, and a second end coupled to the signal output.

11. The memory of claim 10, wherein the voltage converter further comprises:
    an inverter arranged between the signal input and the first capacitor.

12. The memory of claim 10, wherein a voltage level of the first voltage end is configured to be an operating voltage of the IC, and a voltage level of the second voltage end is configured to be a ground voltage.

13. The memory of claim 8, wherein the strobe unit comprises:
a decoder configured to decode the voltage switching signal stored in the memory cell, and to switch on one or more of the plurality of data channels based on the voltage switching signal.

14. The memory of claim 8, wherein the strobe unit is coupled to all or some of the plurality of data channels of the IC.

15. A data channel aging method, for performing an aging test on an integrated circuit (IC), the method comprising:
determining, according to a voltage switching signal, a target voltage state of each of a plurality of data channels in the IC;
switching, based on the voltage switching signal, a conductive state of each of the plurality of data channels; and
adjusting, through a voltage control signal, a voltage level of the each of the plurality of data channels to induce voltage stress aging.

16. An aging method for a memory, wherein the memory comprises an integrated circuit (IC) comprising a plurality of data channels, some of the data channels are configured as machine aging data channels, and the rest of the data channels are configured as voltage aging data channels, and wherein the aging method comprises:
connecting the machine aging data channels to an IC aging machine, the IC aging machine transmitting data to the machine aging data channels;
determining, according to a voltage switching signal, a target voltage state of each of the voltage aging data channels;
switching, based on the voltage switching signal, a conductive state of each of the voltage aging data channels; and
adjusting, through a voltage control signal, a voltage level of each of the voltage aging data channels to induce voltage stress aging.

* * * * *